(12) United States Patent
Han (10) Patent No.: US 7,787,247 B2
(45) Date of Patent: Aug. 31, 2010

(54) CIRCUIT BOARD APPARATUS WITH INDUCED AIR FLOW FOR HEAT DISSIPATION

(75) Inventor: Tai-Sheng Han, Fullerton, CA (US)

(73) Assignee: EVGA Corporation, Brea, CA (US)

( * ) Notice: Subject to any disclaimer, the term of this patent is extended or adjusted under 35 U.S.C. 154(b) by 0 days.

(21) Appl. No.: 11/954,063

(22) Filed: Dec. 11, 2007

(65) Prior Publication Data

US 2009/0147476 A1   Jun. 11, 2009

(51) Int. Cl.
*H05K 7/20* (2006.01)
(52) U.S. Cl. .............................. 361/679.47; 361/679.49; 361/695; 361/697; 361/719; 361/720; 165/80.3; 165/104.33; 165/185; 174/15.1; 174/16.3; 174/252
(58) Field of Classification Search ......... 361/687–697, 361/704–712, 715–724; 165/80.3, 104.33, 165/104.34, 185, 121–126; 174/15.1, 16.3, 174/252; 257/706–727
See application file for complete search history.

(56) References Cited

U.S. PATENT DOCUMENTS

| | | | | |
|---|---|---|---|---|
| 6,301,110 B1 * | 10/2001 | Kodaira | ................ | 361/697 |
| 6,348,748 B1 * | 2/2002 | Yamamoto | ................ | 310/62 |
| 6,411,507 B1 * | 6/2002 | Akram | ................ | 361/690 |
| 6,671,177 B1 * | 12/2003 | Han | ................ | 361/719 |
| 6,747,873 B1 * | 6/2004 | Searls et al. | ................ | 361/695 |
| 6,906,921 B2 * | 6/2005 | Searls et al. | ................ | 361/695 |
| 7,002,797 B1 * | 2/2006 | Wittig | ................ | 361/695 |
| 7,365,989 B2 * | 4/2008 | Peng et al. | ................ | 361/720 |
| 7,382,621 B2 * | 6/2008 | Peng et al. | ................ | 361/719 |
| 7,443,672 B2 * | 10/2008 | Peng et al. | ................ | 361/695 |
| 7,486,519 B2 * | 2/2009 | Loiler et al. | ................ | 361/720 |
| 2005/0183843 A1 * | 8/2005 | Mochizuki et al. | ......... | 165/80.3 |
| 2007/0285890 A1 * | 12/2007 | Tsao et al. | ................ | 361/697 |

FOREIGN PATENT DOCUMENTS

JP           02000124647 A   *   4/2000

* cited by examiner

*Primary Examiner*—Michael V Datskovskiy
(74) *Attorney, Agent, or Firm*—Claude A. S. Hamrick; IPxLAW Group LLP (57) ABSTRACT

A cooling mechanism to dissipate thermal energy generated by the heat generating components of a graphics card assembly. An apparatus includes a circuit board having at least one heat generating component affixed thereto. The apparatus also includes a fan and carrier therefor including a heat sink plate having a portion thermally coupled to the heat generating component. The heat sink plate includes a means for forming at least one slot proximate the portion. The fan is adapted to direct airflow cross the portion. The thermal energy generated by the heat generating component is transferred to the fan carrier and ultimately removed from the fan carrier by the airflow. The airflow inducts a secondary airflow drawn through the slot during operation thereby to enhance transfer of the thermal energy from the heat generating component.

34 Claims, 5 Drawing Sheets

CIRCUIT BOARD APPARATUS WITH INDUCED AIR FLOW FOR HEAT DISSIPATION

BACKGROUND OF THE INVENTION

The present invention generally relates to circuit board apparatus and, more particularly, to an improved circuit board assembly having a mechanism to generate induced air flow for heat dissipation.

In order to enable desktop and other computers to rapidly process graphics and game technology, add-on units generally referred to as "graphics cards" or "VGA" cards" are often installed in computer devices. Such cards include a separate processor, called a GPU, one or more memory chips, and other required circuitry, all mounted to a circuit board including an edge connector that is adapted to plug into an available slot in the associated computer device.

Such cards often have extremely large computing power and, as a consequence, generate substantial heat that if not dissipated will adversely affect operation of the graphics card. Heretofore, various approaches have been tried to dissipate or otherwise remove heat from the thermal energy generating components and normally include some type of fan for blowing air across the heat generating components, and perhaps some type of thermal mass capable of sinking the heat generated. The thermal energy generated by the GPU and memory chips for more sophisticated graphics and games, such as 3-D graphics, may approach the maximum capacity of the existing heat dissipation mechanisms. Thus, there is a need for an improved heat extraction or dissipation mechanism, which can be added to a standard graphics card to efficiently remove thermal energy generated thereby.

SUMMARY OF THE INVENTION

In one aspect of the present invention, an apparatus with improved heat dissipation includes a circuit board having at least one heat generating component affixed thereto. The apparatus also includes a fan and carrier therefor including a heat sink plate having a portion thermally coupled to the heat generating component. The heat sink plate includes a means for forming at least one slot proximate the portion. The fan is adapted to direct airflow cross the portion. The thermal energy generated by the heat generating component is transferred to the fan carrier and ultimately removed from the fan carrier by the airflow. The airflow inducts a secondary airflow drawn through the slot during operation thereby to enhance transfer of the thermal energy from the heat generating component.

In another aspect of the present invention, an assembly includes a printed circuit board with at least one heat generating component affixed thereto, and a heat dissipating mechanism also affixed to the printed circuit board for removing thermal energy from the heat generating component. An improved heat dissipating mechanism includes a fan and carrier therefor including a heat sink plate having a portion thermally coupled to the heat generating component. The heat sink plate includes a means for forming at least one slot proximate the portion. The fan is adapted to direct airflow cross the portion. The thermal energy generated by said heat generating component is transferred to the fan carrier and ultimately removed from the fan carrier by the airflow. The airflow inducts a secondary airflow drawn through the slot during operation thereby to enhance transfer of the thermal energy from the heat generating component.

DETAILED DESCRIPTION OF THE INVENTION

The following detailed description is of currently contemplated modes of carrying out the invention. The description is not to be taken in a limiting sense, but is made merely for the purpose of illustrating the general principles of the invention, since the scope of the invention is best defined by the appended claims.

Figure 1:
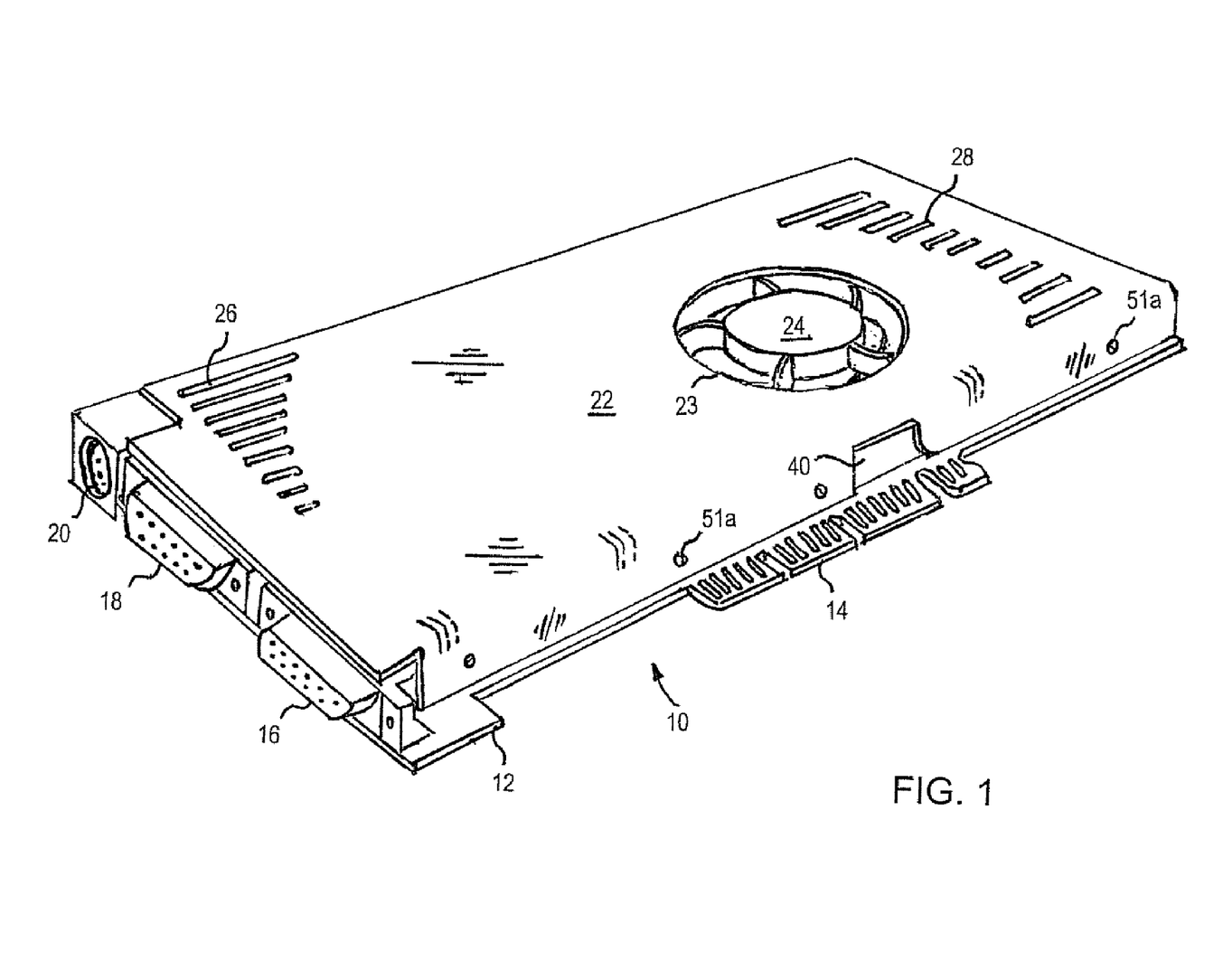
FIG. 1 is a perspective view showing a presently preferred embodiment of a graphics card assembly including a heat dissipating subassembly in accordance with the present invention.

Referring to FIG. 1 of the drawing, a graphics card assembly in accordance with the present invention is illustrated at 10 and includes a printed circuit board 12 having an edge connector 14. For the purpose of illustration, the printed circuit board 12 is described as a graphics card in the present application. However, it should be apparent to those of ordinary skill that the printed circuit board 12 can be other types of circuit board, such as motherboard, having one or more heat generating components, such as CPU and chipset. Various cabling connectors 16, 18, and 20 are secured to the printed circuit board 12 and used to communicate electrical signals into and out of the assembly. Affixed to the printed circuit board 12 is a fan carrier 40 secured to a top cover 22 by means of screws or other suitable fasteners 51a. The near right side portion of the top cover 22, as depicted, can be formed by bending a portion of the top cover 22 that is preferably formed of, but not limited to, metal, along the substantially entire length of the assembly 10. The top cover 22 includes a circular aperture 23 and slots 26, 28 through which airflow can pass. Positioned within the aperture 23 and affixed to and carried by the carrier 40 is a fan unit 24. Note that the upper surface of the top cover 22 is substantially flat and ideally suited for decorative graphics, manufactures or marketers trademarks, etc.

In use, the graphics card assembly 10 is oriented so as to have the near right side of the assembly, as depicted, facing a slot on a computer motherboard and mounted thereto by slipping the edge connector 14 into the slot so that the assembly communicates with devices on the motherboard via the edge connector 14. As describe in more detail below, heat generated by the electronic components of the assembly is transferred to the fan carrier 40 that is cooled by the airflow created by the fan unit 24, as will also be further elucidated below.

Figure 2:
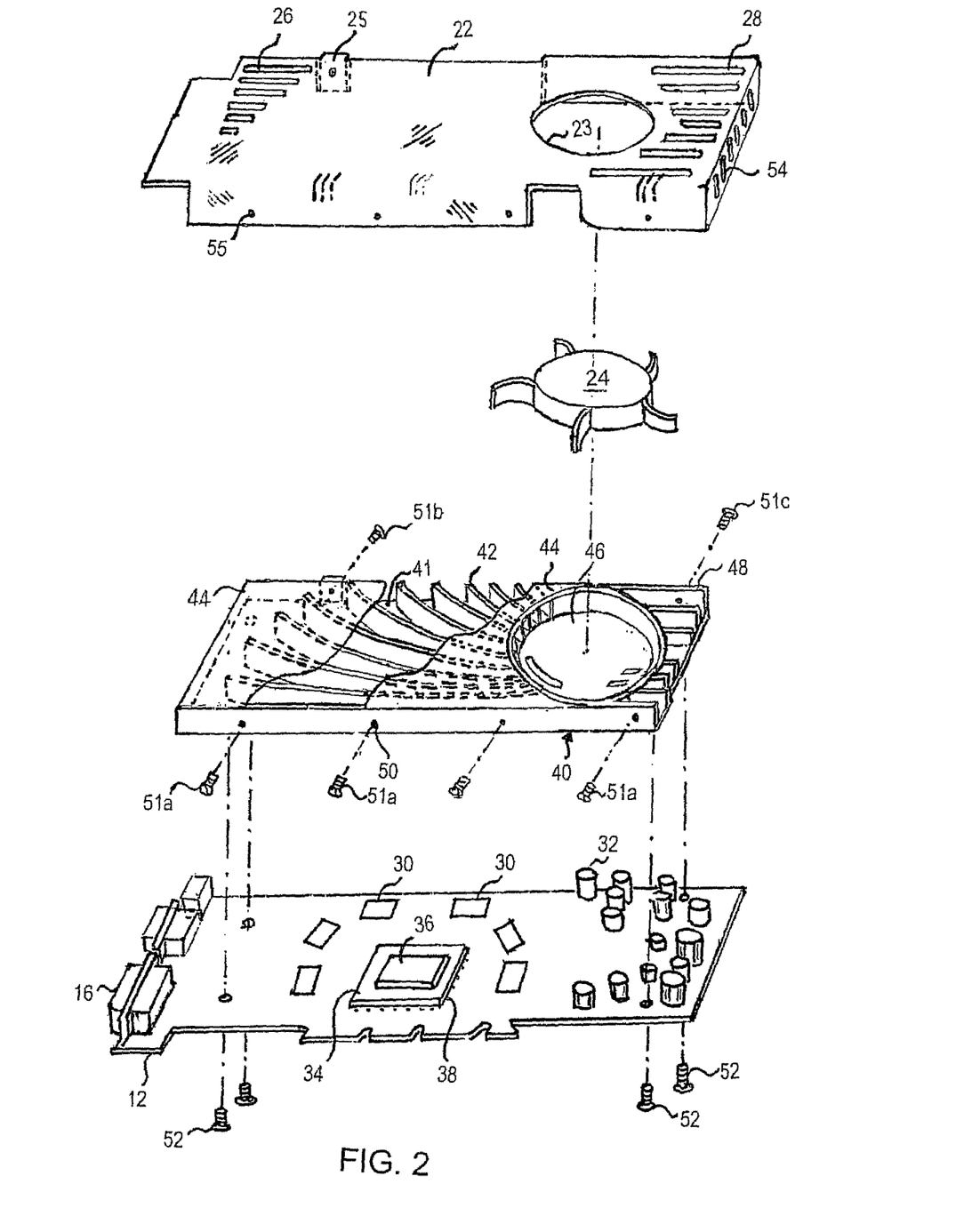
FIG. 2 is an exploded perspective view showing the several components of the assembly illustrated in FIG. 1.

In FIG. 2, the top cover 22, fan unit 24, and fan carrier 40 are shown exploded away from the printed circuit board 12. The board 12 includes various types of electronic components 32. Active heat generating components (or, shortly active component) will be positioned at 30 and can generate heat energy during operation. The active heat generating components, such as memory, are not shown in FIG. 2 for brevity. As will be further explained below, the lower plate 41 of the fan carrier 40 may have protrusions that intimately engage the top surfaces of the active components and transfer heat energy therefrom.

The foremost side of the top cover 22, as depicted in FIG. 2, overlaps the front side of the fan carrier 40 along the length of the fan carrier 40. The fan carrier 40 includes threaded openings 50 for receiving the screws or other suitable fasteners 51*a* that secure the top cover 22 to the fan carrier 40. The top cover 22 also includes a tap 25 with a hole or opening through which the screw 51*b* for mounting the top cover 22 to the fan carrier 40 pass. The top cover 22 further includes one or more holes or openings (not shown in FIG. 2) formed on the rearmost right side, as depicted in FIG. 2, through which one or more the screws 51*c* for mounting the top cover 22 to the fan carrier 40 pass. The screws 51*a*, 51*b*, and 51*c* engage threaded openings formed in the fan carrier 40.

As depicted, a GPU PCB 34 is mounted on the board 12 by means of Ball Grid Array (BGA) solder bumps 38, and a GPU 36 is mounted on the GPU PCB 34. The GPU 36 may generate substantial amount of heat energy during operation, which will be transferred to and dissipated by the fan carrier 40. As will be further explained below, the fan carrier 40 includes a thermal block positioned above and being in physical contact with the GPU 36 to transfer heat energy therefrom. As discussed above, the assembly 10 can be used to remove thermal energy from other types of heat generating components, such as CPU and chipset, affixed to a motherboard (not shown in FIG. 2).

The fan carrier 40 includes heat conducting components: a lower plate (or, equivalently a heat sink plate) 41, an upper plate 44, and elongated vanes 42 disposed between the lower and upper plates. The heat conducting components may be formed of aluminum, copper, steel, or other suitable material capable of serving as heat sink. The fan unit 24 will be installed inside a space 46 in the fan carrier 40. In FIG. 2, for the purpose of illustration, a portion of the upper plate 44 is broken away, revealing the vanes 42 and the lower plate 41 thereunder. The fan carrier 40 with fan unit 24 installed thereto is aligned with the aperture or opening 23 so that the fan unit 24 can draw cooling air therethrough during operation. The air drawn in by the fan unit 24 passes through the air passageways defined by the upper plate 44, lower plate 41 and vanes 42, extracting thermal energy from the fan carrier before it is discharged through the slots 26 and the openings in the rearmost left side of the top cover 22, as depicted in FIG. 2. The fan carrier 40 further includes radiator fins 48 standing up from the lower plate 41 and configured to radiate heat energy to the surrounding air. The top cover 22 includes slots 28 and 54 for ventilating the radiator fins 48.

The lower plate 41 of the fan carrier 40 is secured to the printed circuit board 12 by multiple screws or other suitable fasteners 52, providing a firm contact between the top surface of the GPU 36 and the lower plate 41, more specifically, the thermal block (now shown in FIG. 2) affixed to the lower plate 41.

It is noted that two or more of the components of the fan carrier 40 may be formed as an integral body. For instance, the radiator fins 48 and the lower plate 41 may be formed as an integral body by means of molding. It is also noted that the top flat portion of the top cover 22 may be spaced apart from the upper plate 44 or in direct contact with the upper plate 44 so that a portion of the heat energy contained in the upper plate 44 can be transferred to the top cover 22 and dissipated by the top cover 22.

Figure 3:
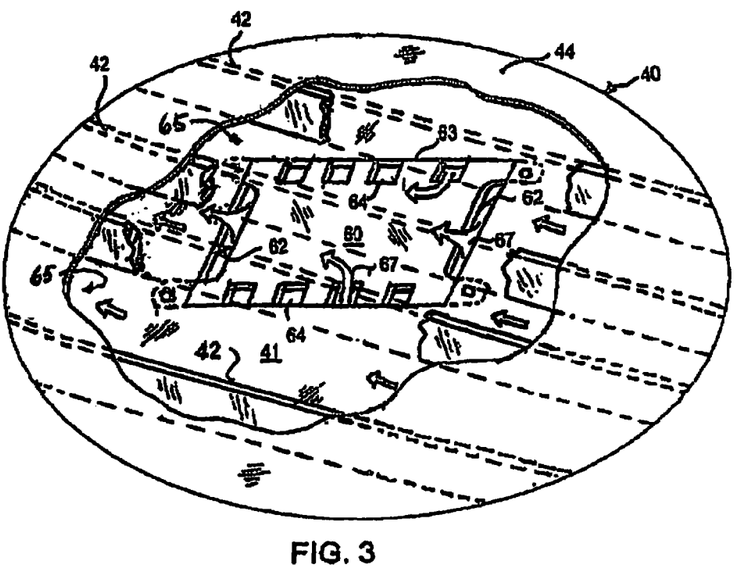
FIG. 3 is a partial cut away perspective view of a fan carrier of FIG. 2, showing the thermal block included therein.
Figure 4:
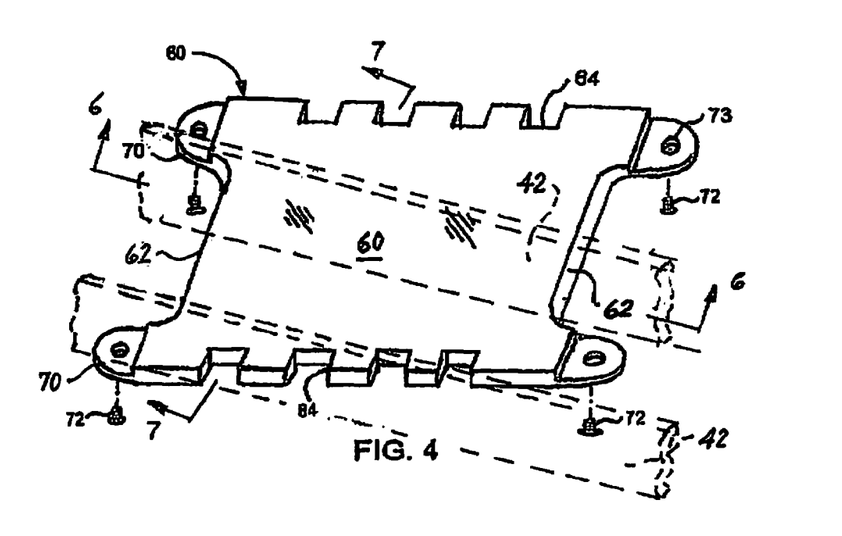
FIG. 4 is a top perspective view of the thermal block of FIG. 3.

FIG. 3 is a partial cut away perspective view of the fan carrier 40 revealing the upper surface of the thermal block 60 included therein as well as the flow direction vanes 42 which cross thereover, the vanes 42 being broken away and shown in phantom dashed lines for clarity. FIG. 4 is a perspective view showing the top surface of the thermal block 60 removed from an opening 63 in the plate 41 (depicted in FIG. 3) together with some of the vanes 42 (shown in phantom dashed lines for clarity). As depicted, the thermal block 60 has a generally rectangular shape with tabs 70 formed at the four corners thereof. Each tab 70 has a hole 73 through which a fastener 72 for securing the thermal block 60 to the lower plate 41 passes. As a variation, the tabs 70 may be soldered or brazed to the lower plate 41. The thermal block 60 is installed in the rectangular opening 63 formed in the lower plate 41 and includes recessed portions 64 formed on two opposite side edges thereof. The thermal block 60 also includes two elongated recessed portions 62 formed in the opposite ends thereof. When installed in the opening 63, the recessed portions 62, 64 form slots through which airflow can pass. Hereinafter, the terms recessed portion and slot are used interchangeably. The size, shape and number of recessed portions 62, 64 may be varied without deviating from the spirit and scope of the present invention. The thermal block 60 may be formed of aluminum, steel, copper, or other suitable material capable of serving as a heat sink.

Figure 6:
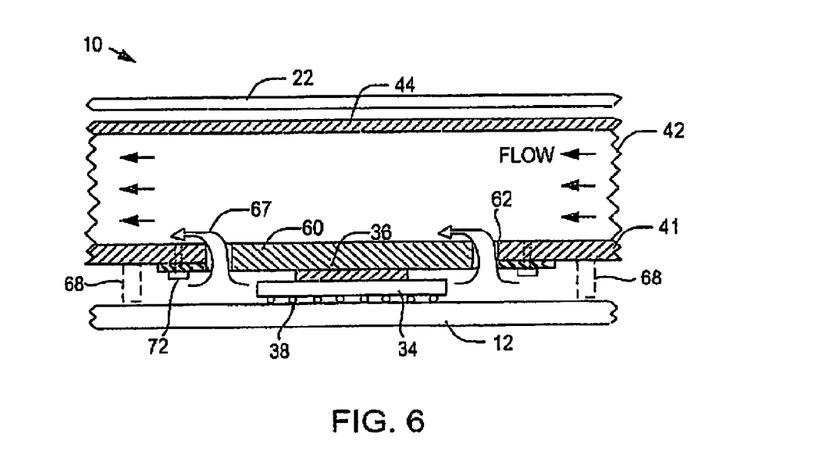
FIG. 6 is a schematic cross sectional view of the assembly of FIG. 1, taken along the direction 6-6 in FIG. 4.

As will be further explained below in conjunction with FIG. 6, the thermal block 60 is flush-mounted relative to the upper surface of lower plate 41 so that the top surface of the thermal block 60 and the top surface of the lower plate 41 are on the same plane. In FIG. 3, only three vanes are shown to extend across the thermal block 60. However, it should be apparent to those of ordinary skill that the lateral intervals between vanes 42 can be varied so as to change the number of vanes crossing the thermal block 60.

As the cooling air drawn in by the fan unit 24 through the aperture 23 (FIG. 2) is caused to pass through the air passageways 65 formed by the vanes 42, the air extracts heat energy from the fan carrier 40. Due to the airflow across the passageways 65, the pressure in the passageways 65 is lower than the ambient atmospheric pressure, generating a pressure difference between the top and bottom surfaces of the lower plate 41. This pressure difference in turn induces secondary air flow 67 through the slots 62 and 64, i.e., the pressure difference inducts additional airflow for cooling the thermal block 60 into the air passageways 65. An experiment performed by the present inventor shows that the secondary flow 67 reduces the temperature of the thermal block 60 by at least one degree Celsius.

Figure 5:
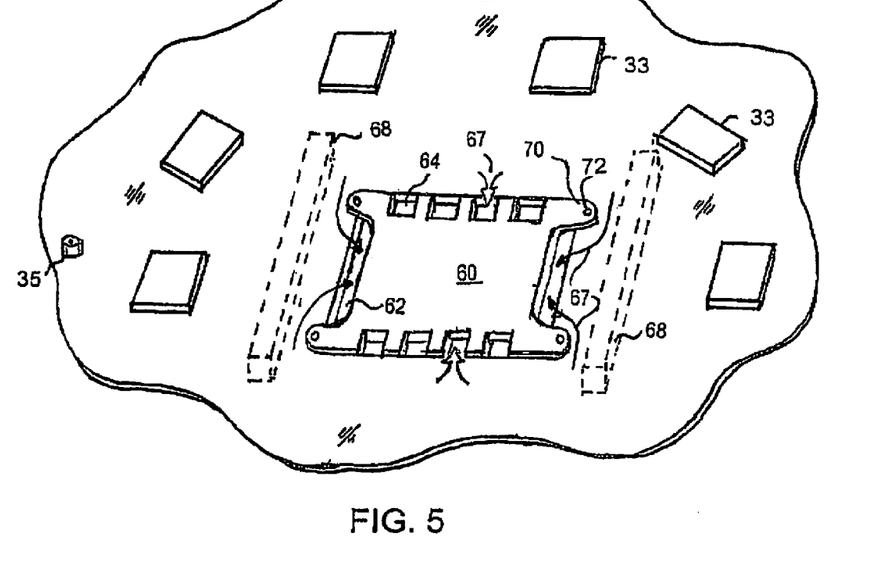
FIG. 5 is a broken bottom perspective view showing the lower plate of FIG. 2 and the thermal block affixed thereto.

FIG. 5 is a broken perspective view showing the bottom surfaces of thermal block 60 and a portion of the lower plate 41. FIG. 6 is a schematic cross sectional view of a portion of the assembly 10, taken along the line 6-6 in FIG. 4. As depicted, the thermal block 60 is aligned with the GPU 36 in the horizontal direction so that the bottom surface of the thermal block 60 physically engages the top surface of the GPU 36. Alternatively, the thermal block 60 may be secured to the GPU 36 by applying heat conducting adhesive therebetween. As discussed above, the secondary air flow 67 passes through the slots 62, 64, further cooling the thermal block 60 during operation.

Formed on the bottom surface of the lower plate 41 are multiple rectangular pads or protrusions 33 intended to physically engage the top surfaces of active components to be positioned at 30 (shown in FIG. 2) and to transfer thermal energy therefrom to plate 41. The lower plate 41 may also include spacing legs or risers 35 (FIG. 5) having threaded holes that receive the fasteners 52 (shown in FIG. 2) for securing the lower plate 41 to the printed circuit board 12. The thermal energy generated by the CPU 36 and active components will be respectively transferred to the thermal block 60 and the protrusions 33, and thence to the lower plate 41.

In an alternative embodiment, one or more flow directing fences 68 (shown in dashed lines in FIGS. 5 and 6) may be disposed beneath the bottom surface of the lower plate 41. The fences 68 may have a substantially bar shape and extend in a direction substantially parallel to the elongated slots 62, defining opposite sides of a space that surrounds the bottom surface of the thermal block 60 (and the GPU 36). The fences 68 impede airflow thereacross so that most of the air flowing in the secondary flow 67 into and through the openings 62 and 64 comes from the space surrounding block 60 to thereby enhance the flow motion around and beneath the perimeter of the thermal block 60. As a variation, the fences 68 and the lower plate 41 may be formed as an integral body.

Figure 7:
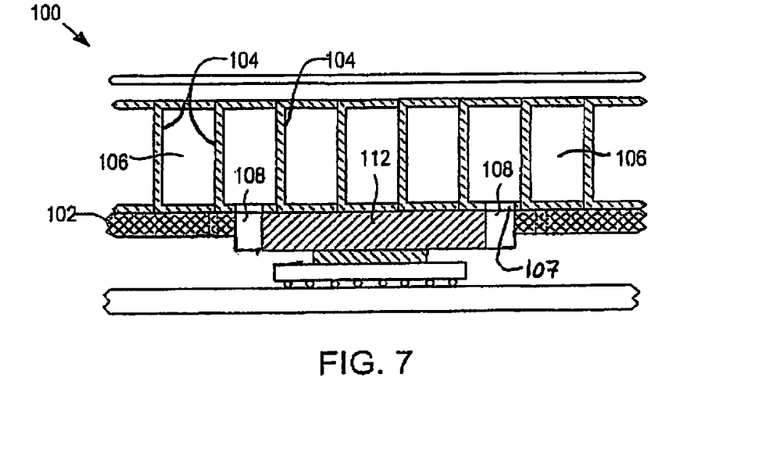
FIG. 7 is a schematic cross sectional view of another embodiment of a graphics card assembly, taken along the direction 7-7 of FIG. 4 in accordance with the present invention.

FIG. 7 is a schematic cross sectional view of another embodiment of a graphics card assembly 100, taken along a line similar to the direction 7-7 shown in the embodiment of FIG. 4. As depicted, a plurality of vanes 104 may be affixed to the top surfaces of the lower plate 102 and the thermal block 112 by means of soldering, brazing, or heat conduction adhesive to form flow passageways 106 directed normal to the plane of the drawing. Each vane 104 has a generally c-shaped cross section, i.e., each vane is formed by an elongated c-shaped channel member having upper and lower flanges. The flanges of each vane member contact an adjacent vane member to form an air passageway 106. For those vane members passing directly over openings 108 in the perimeter of the thermal block 112, a corresponding opening 107 is formed in the lower flange thereof so as not to block the openings 108. As in the previously described embodiment, a secondary flow induced by the pressure difference between the top and bottom surfaces of the lower plate 102 passes through the slots 108 and openings 107. In this embodiment, the top flanges of the vanes 104 collectively form a substantially flat plate having segmented sections, where the plate is substantially equivalent to and thereby replaces the upper plate 44 in the embodiment of FIG. 3. It is noted that the assembly 100 may have flow directing fences (not shown in FIG. 7) beneath the lower plate 102 as an option.

Figure 8:
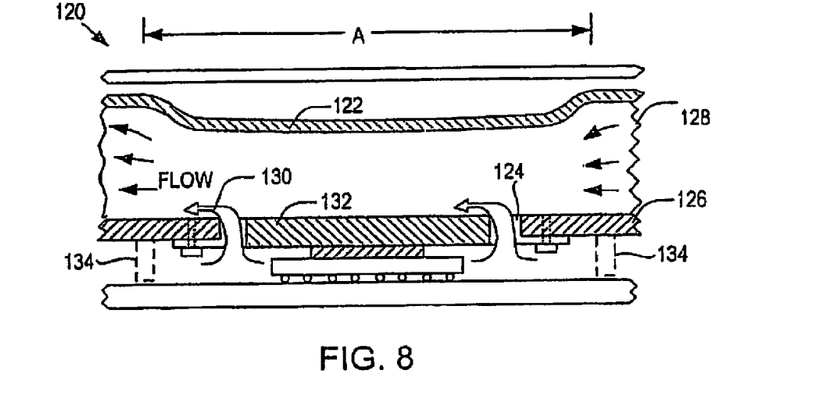
FIG. 8 is a schematic cross sectional view of yet another embodiment of a graphics card assembly, taken along the direction 7-7 in accordance with the present invention.

FIG. 8 is a schematic cross sectional view of yet another embodiment of a graphics card assembly 120, taken along the direction 6-6 in accordance with the present invention. As depicted, the components of the assembly 120 are similar to those of the assembly 10, with the principal difference being that the upper plate 122 includes a varying surface curvature relative to the lower plate 126. More specifically, the upper plate 122 has a portion A that is convex relative to the lower plate 126, and the slots 124 are located within the portion A. The pressure in an air duct or passageway decreases as the cross sectional area of the passageway decreases. Thus, in air passageways defined by the upper plate 122, lower plate 126, and vanes 128, the air pressure within the portion A will be lower than that outside the portion A. Given that the static pressure at the bottom surface of the lower plate 126 is the same as the pressure at the bottom surface of the lower plate 41 in FIG. 3, the pressure difference between the top and bottom surfaces of the lower plate 126 will be larger than that between the top and bottom surfaces of the lower plate 41. As the flow rate of secondary flow 130 increases as the pressure difference increases, the configuration of the upper plate 122 will enhance the secondary flow rate and thereby enhance the efficiency in cooling the thermal block 132 during operation. As a variation, flow directing fences 134 may be disposed beneath the lower plate 126.

It is noted that the fan 24 could be reversed to draw cooling air from the slots 26 and opening sides of the top cover 22 and exhausted out through the opening 23 in the top cover 22. Flow in this direction would likewise induct the secondary flow through the slots 62, 64, enhancing the efficiency in cooling the thermal block during operation.

Figure 9:
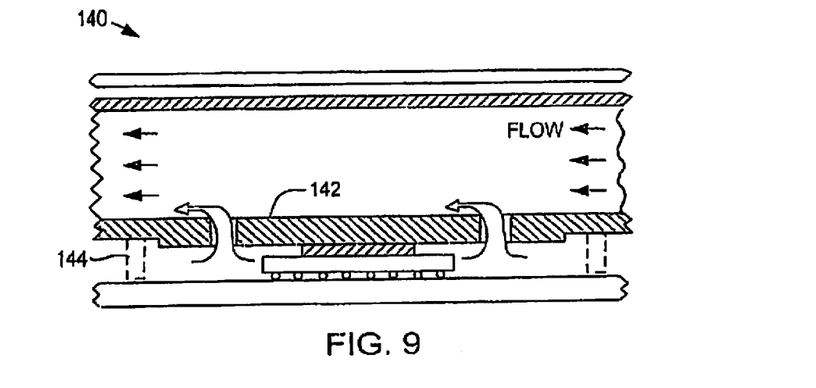
FIG. 9 is a schematic cross sectional view of still another embodiment of a graphics card assembly, taken along the direction 7-7 in accordance with the present invention.

In FIGS. 3 and 4, the thermal block 60 and the lower plate 41 are shown as two components secured to each other. However, it should be apparent to those of ordinary skill that they can be molded as an integral body with the slots 62 and 64 formed therein. FIG. 9 is a schematic cross sectional view of yet another embodiment of a graphics card assembly 140, taken along the direction 6-6 in accordance with the present invention. In this embodiment, the thermal block and lower plate form an integral body 142. As a variation, flow directing fences 144 may be disposed beneath the plate 142.

As discussed above, the exemplary embodiments of the assembly in FIGS. 1-9 are described as means for removing thermal energy from GPUs and active electronic components, such as memories. However, it should be apparent to those of ordinary skill that the assembly can be used to remove heat energy from other types of heat generating components, such as CPUs and chipsets. For instance, the thermal bock may be in contact with a CPU and/or a chipset affixed to a motherboard and transfer thermal energy from the CPU and/or a chipset. As a variation, the protrusion 33 can be arranged to physically engage the top surfaces of CPUs and/or chipsets and transfer thermal energy therefrom.

Notwithstanding that the present invention has been described above in terms of several alternative embodiments, it is anticipated that still other alterations and modifications will become apparent to those of ordinary skilled in the art after having read this disclosure. It is therefore intended that such disclosure be considered illustrative and not limiting, and that the appended claims be interpreted to include all such alterations, modifications and embodiments as fall within the true spirit and scope of the invention.

What is claimed is:

1. An apparatus with improved heat dissipation, comprising:
   a circuit board with at least one heat generating component affixed thereto; and
   a fan and carrier therefor including a heat sink plate and means forming an airflow passageway over a surface thereof, said heat sink plate having a portion thereof along said passageway and downstream of said fan thermally coupled to said heat generating component on one side of said heat sink plate opposite a second side thereof forming said surface, said heat sink plate having means forming at least one slot therein proximate a bounding edge of said portion, said fan being adapted to direct an airflow through said passageway and over said surface, said slot and said portion;
   wherein thermal energy generated by said heat generating component is transferred to said heat sink plate and ultimately removed therefrom by said airflow, and wherein said airflow passing through said passageway and over said slot reduces the atmospheric pressure over said slot and thereby induces a secondary airflow through said slot from said one side of said heat sink plate to said second side during operation of said fan, thereby enhancing removal of thermal energy from said heat generating component.

2. An apparatus as recited in claim 1, wherein said heat sink plate includes an opening formed therein defining said portion, and a thermal block flush-mounted within said opening and having at least one recessed portion on an edge thereof cooperating with an edge of said heat sink plate defining said opening to form said slot.

3. An apparatus as recited in claim 1, wherein said portion is configured as a thermal block formed as an integral part of said heat sink plate.

4. An apparatus as recited in claim 2, wherein said thermal block is formed of metal and includes a plurality of additional recessed portions formed along at least one other edge thereof, said additional recessed portions cooperating with an edge of said heat sink plate defining said opening to form additional slots through which said airflow induces additional secondary airflow during operation of said fan.

5. An apparatus as recited in claim 1, further comprising:
flow directing vanes disposed within said passageway and on said heat sink plate and configured to direct said airflow from said fan across said surface and said portion.

6. An apparatus as recited in claim 5, wherein each said vane includes a generally elongated strip, and further comprising:
an upper plate disposed directly on said vanes so that said vanes, said heat sink plate, and said upper plate form a plurality of air passageways through which said airflow flows in passing from said fan across said surface and said portion.

7. An apparatus as recited in claim 6, wherein said upper plate has a portion that is convex relative to said heat sink plate and positioned over said slot to increase the velocity of the airflow passing thereover.

8. An apparatus as recited in claim 5, wherein said vanes are formed by a plurality of elongated c-shaped channels positioned in adjacent parallel relationship and affixed to said heat sink plate.

9. An apparatus as recited in claim 1, further comprising:
a top cover secured to said fan carrier and including an opening through which said fan draws air.

10. An apparatus as recited in claim 1, further comprising:
a plurality of radiator fins disposed directly on said heat sink plate and configured to transfer thermal energy to an ambient atmosphere.

11. An apparatus as recited in claim 10, further comprising:
a top cover secured to said fan carrier and including slots for ventilating said fins and an opening through which said fan draws air.

12. An apparatus as recited in claim 1, wherein said circuit board includes multiple heat generating elements affixed thereto, further comprising:
a plurality of protrusions disposed beneath a bottom surface of said heat sink plate and configured to physically contact said elements to transfer thermal energy generated by said elements to said heat sink plate during operation.

13. An apparatus as recited in claim 1, further comprising:
a pair of flow directing fences respectively disposed on opposite sides of said portion and beneath a bottom surface of said heat sink plate on said one side thereof to at least partially define a region of space surrounding said portion and occupied by said heat generating component,
wherein most of the air in said secondary flow comes from said space to enhance transfer of thermal energy from said heat generating component.

14. An apparatus as recited in claim 1, wherein said circuit board forms part of a graphics card.

15. An apparatus as recited in claim 14, wherein said heat generating component includes a GPU.

16. In an assembly including a printed circuit board with at least one heat generating component affixed thereto, and a heat dissipating mechanism also affixed to said printed circuit board for removing thermal energy from the heat generating component, an improved heat dissipating mechanism comprising:
a fan and carrier therefor including a heat sink plate and means forming an airflow passageway over a surface thereof, said heat sink plate having a portion thereof within said passageway thermally coupled to said heat generating component, said portion having a means forming at least one slot proximate a bounding edge of said portion, said fan being adapted to direct an airflow through said passageway and over said surface, said slot and said portion;
wherein thermal energy generated by said heat generating component is transferred to said heat sink plate and ultimately removed therefrom by said airflow, and wherein said airflow passing through said passageway and over said slot reduces the atmospheric pressure over said slot and thereby induces a secondary airflow through said slot during operation, thereby enhancing transfer of thermal energy from said heat generating component.

17. In an assembly as recited in claim 16, wherein said means includes a thermal block flush-mounted to said plate and having at least one recessed portion on an edge thereof to form said slot.

18. In an assembly as recited in claim 16, wherein said portion is configured as a thermal block formed as an integral part of said heat sink plate.

19. In an assembly as recited in claim 17, wherein said thermal block is formed of metal.

20. In an assembly as recited in claim 16 and further comprising:
flow directing vanes disposed within said passageway and on said heat sink plate and configured to direct said airflow from said fan across said surface and said portion.

21. In an assembly as recited in claim 20, wherein each said vane includes a generally elongated strip, and further comprising:
an upper plate disposed directly on said vanes so that said vanes, said heat sink plate, and said upper plate form a plurality of channels in said air passageway through which said airflow flows in passing from said fan across said surface and said portion.

22. In an assembly as recited in claim 21, wherein said upper plate has a portion convex relative to said heat sink plate and said portion is positioned over said slot to reduce the cross sectional area of said passageway and thereby increase the velocity of the airflow passing thereover.

23. In an assembly as recited in claim 20, wherein said vanes are formed by a plurality of elongated c-shaped channels positioned in adjacent parallel relationship and affixed to said heat sink plate.

24. In an assembly as recited in claim 16 and further comprising:
   a top cover secured to said fan carrier and including an opening through which said fan draws air.

25. In an assembly as recited in claim 16 and further comprising:
   a plurality of radiator fins disposed directly on said heat sink plate and configured to transfer thermal energy to an ambient atmosphere.

26. In an assembly as recited in claim 16 and further comprising:
   a top cover secured to said fan carrier and including slots for ventilating said fins and an opening through which said fan draws air.

27. In an assembly as recited in claim 16, wherein said printed circuit board includes multiple heat generating elements affixed thereto, and further comprising:
   a plurality of protrusions disposed beneath a bottom surface of said heat sink plate and configured to physically contact said elements thereby to transfer thermal energy generated by said elements therefrom during operation.

28. In an assembly as recited in claim 16 and further comprising:
   a pair of flow directing fences respectively disposed on opposite sides of said portion and beneath a bottom surface of said heat sink plate on said one side thereof to at least partially define a region of space surrounding said portion and occupied by said heat generating component,
   wherein most of the air in said secondary flow comes from said region of space to thereby enhance transfer of thermal energy from said heat generating component.

29. An apparatus for transferring thermal energy from at least one heat generating component affixed to a circuit board or the like, comprising:
   a fan for generating an airflow; and
   fan carrying means including a heat sink plate means and a plurality of flow directing vanes defining a plurality of airflow passageways which pass over one side of said heat sink plate means, at least some of said passageways passing across a thermal energy transfer portion of said heat sink plate means adapted to be thermally coupled on the other side thereof to a heat generating component, said heat sink plate means having at least one slot formed therein and disposed proximate a bounding edge of said thermal energy transfer portion, said fan being adapted to cause an airflow through said passageways and across said slot and said thermal energy transfer portion;
   wherein thermal energy generated by the heat generating component and transferred to said heat sink plate means is removed therefrom by said airflow, and wherein the airflow through the passageways passing over said slot induces a secondary airflow through said slot from a region of space on the opposite side of said heat sink plate means and adjacent at least one side of the heat generating component to the inducing passageways, thereby enhancing removal of thermal energy from the heat generating component.

30. An apparatus for transferring thermal energy as recited in claim 29, wherein said thermal energy transfer portion is defined by a thermal block forming a part of said heat sink plate means.

31. An apparatus for transferring thermal energy as recited in claim 30, wherein said heat sink plate means includes an opening formed therein and wherein said thermal block is flush-mounted within said opening and has at least one recessed portion on an edge thereof which cooperates with an edge of said opening to form said slot.

32. An apparatus for transferring thermal energy as recited in claim 31, wherein said thermal block is formed of metal and includes additional recessed portions formed along at least one other edge thereof, said additional recessed portions cooperating with said heat sink plate means to form additional slots through which said airflow induces secondary airflow during operation.

33. An apparatus for transferring thermal energy as recited in claim 29, further comprising:
   at least one flow directing fence disposed beneath said other side of said heat sink plate means and proximate said slot, said fence defining at least one side of said region of space beneath said slot and proximate a bounding edge of said thermal energy transfer portion.

34. An apparatus for transferring thermal energy as recited in claim 33, wherein said heat sink plate means has at least one other slot formed therein and disposed on a side of said thermal energy transfer portion opposite said one slot and proximate another bounding edge of said thermal energy transfer portion, said fan being adapted to cause said airflow through at least some of said passageways to also flow across said other slot to induce another secondary airflow through said other slot from a region of space adjacent at least one other side of the heat generating component to the inducing passageways, thereby further enhancing removal of thermal energy from the heat generating component.

* * * * *